(12) United States Patent
Goh et al.

(10) Patent No.: US 7,842,957 B2
(45) Date of Patent: Nov. 30, 2010

(54) OPTICAL TRANSCEIVER WITH REDUCED HEIGHT

(75) Inventors: Teck Chai Goh, Singapore (SG); Deng Peng Chen, Singapore (SG); Basoor Suresh, Singapore (SG); Wee Sin Tan, Singapore (SG); Peng Yam Ng, Singapore (SG); Sin Heng Lim, Singapore (SG); Pak Hong Yee, Singapore (SG)

(73) Assignee: Avago Technologies ECBU IP (Singapore) Pte, Ltd., Singapore (SG)

( * ) Notice: Subject to any disclaimer, the term of this patent is extended or adjusted under 35 U.S.C. 154(b) by 901 days.

(21) Appl. No.: 11/683,876

(22) Filed: Mar. 8, 2007

(65) Prior Publication Data

US 2008/0219673 A1    Sep. 11, 2008

(51) Int. Cl.
  *H01L 31/12*    (2006.01)
  *H01L 31/16*    (2006.01)
(52) U.S. Cl. .................... 257/82; 257/13; 257/21; 257/80; 257/99; 257/E21.001; 257/E25.02; 257/E33.072; 250/221; 250/231.13; 250/231.14; 250/239

(58) Field of Classification Search .................... 257/13, 257/21, 80, 82, 99, E21.001, E25.02, E33.072; 250/221, 231.13, 231.14, 239
See application file for complete search history.

(56) References Cited

U.S. PATENT DOCUMENTS 4,309,605 A * 1/1982 Okabe ..................... 250/239
7,309,855 B2 * 12/2007 Nagasaka et al. ...... 250/231.14

* cited by examiner

*Primary Examiner*—Dao H Nguyen

(57) ABSTRACT

A transceiver having a light source die, a photodetector die and a substrate is disclosed. The substrate has a first well in which the light source die is mounted and a second well in which the photodetector die is mounted. The substrate has a reflective surface which blocks light leaving the light source from reaching the photodetector unless the light is reflected by an object external to the transceiver. The reflecting surface of the second well in the substrate is shaped to concentrate light received from outside the transceiver onto the photodetector, and in one aspect of the invention it comprises a nonimaging optical element. The light source is powered by applying a potential between first and second contacts on the light source die. A signal is generated between first and second contacts on the photodetector die in response to illumination of the photodetector die.

20 Claims, 3 Drawing Sheets

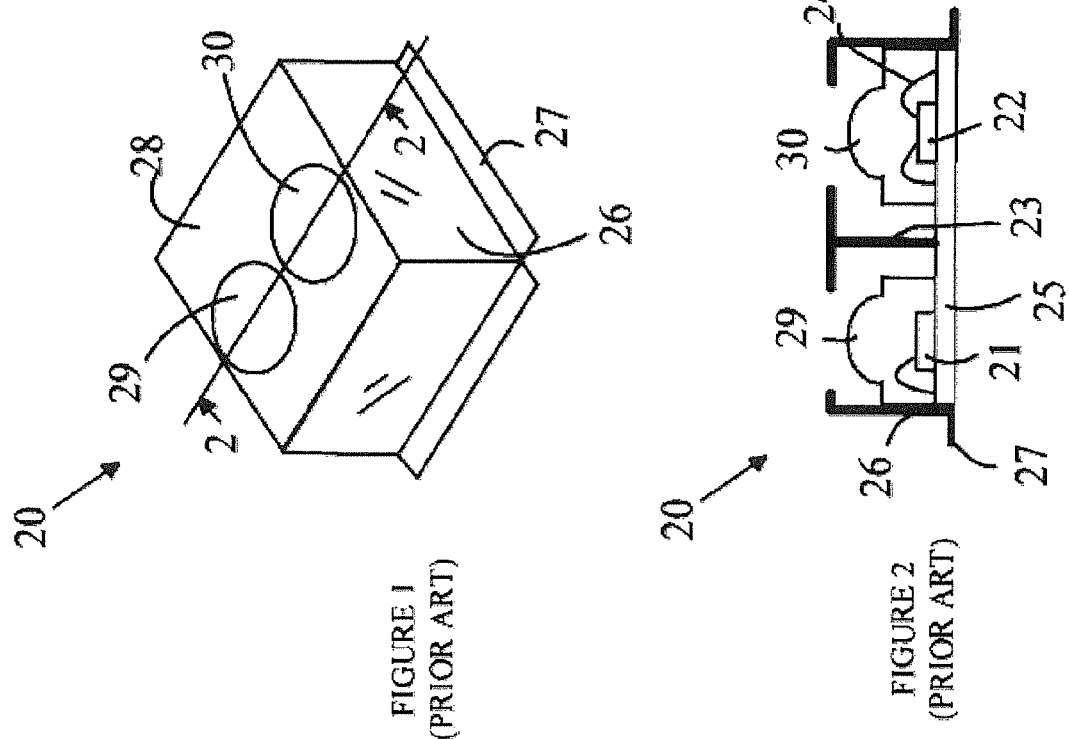

OPTICAL TRANSCEIVER WITH REDUCED HEIGHT

BACKGROUND OF THE INVENTION

Optical transceivers are utilized in a number of systems to transmit and receive data and to implement proximity detectors. Such devices typically include a light source, which is typically a light emitting diode (LED) that is used to transmit data by modulating the intensity of the light source and a photodiode that receives the modulated light signals. Optical transceivers operating in the infrared are utilized in computers and handheld devices for transferring data from one device to another without requiring that the devices be connected together by a wire or cable. In such systems, the two devices are positioned relative to one another such that light from the transmitter in the first device is received by the optical receiver in the second device, and vice versa.

In a proximity detector, the light from a transmitter in the transceiver is received by the receiver in that transceiver after the light has been reflected from the surface of an object that is being detected. The amount of light that is received by the receiver is a function of the surface properties of the object and the distance between the object and the transceiver. Such proximity detectors are utilized in handheld devices such as cellular telephones to adjust the amplifier levels in response to the user placing the device close to the user's face.

The light levels received by the photodiode in the receiver can be quite small. The beam profile from the transmitter is spread by the reflecting surface which is typically a surface having a low reflectivity that introduces a significant degree of scattering into the optical path. Hence, the receiver sees a beam having a cross-section that is much larger than the photodiode. As a result, the fraction of the light that enters the receiver is only a small fraction of the light that left the transmitter. Hence, the signal-to-noise ratio in the receiver can be quite small.

To improve the signal-to-noise ratio, the collection angle of the receiver is increased by providing a lens that collects light over an area that is much larger than the photodiode and then focuses that light on the photodiode. In addition, a collimating lens can be provided over the transmitter to shape the profile of the illumination source to provide a smaller beam cross-section at the receiver. While these lenses improve the signal-to-noise ratio, they increase the height of the transceiver.

However, in many applications, there is a limit to the size of the transceiver. Many handheld devices such as cellular telephones fall into this category. Hence, this solution is not always viable when a small transceiver is required.

In addition, the lenses can introduce cross-talk into the transceiver. Light from the transmitter is reflected off of the lens-air surfaces and reaches the receiver. Since the signal-to-noise ratio is already compromised by the small fraction of the light reflected by the object of interest that reaches the receiver, this cross-talk can pose a significant problem. To reduce the cross-talk, additional light blocking baffles must be introduced between the receiver and transmitter. Such baffles further increase the cost and size of the transceiver.

SUMMARY OF THE INVENTION

The present invention includes a transceiver having a light source die, a photodetector die and a substrate. The substrate has a first well in which the light source die is mounted and a second well in which the photodetector die is mounted. The substrate has a reflective surface which blocks light leaving the light source from reaching the photodetector unless the light is reflected by an object external to the transceiver. The second well in the substrate has a reflecting surface that is shaped to concentrate light received from outside the transceiver onto the photodetector. The light source emits light of a predetermined wavelength when powered by applying a potential between first and second contacts on the light source die. The photodetector generates a signal between first and second contacts on the photodetector die in response to illumination of the photodetector die by light of the predetermined wavelength. The substrate has four substrate contacts, the first and second of these contacts being electrically connected to the first and second light source die contacts, while the third and fourth of these contacts are electrically connected to the first and second photodetector die contacts. In one aspect of the invention, the four substrate contacts are electrically connected to pads on the outside surface of the substrate. In another aspect of the invention, the light source die and the photodetector die are encapsulated between a layer of clear electrically insulating material and the substrate. In a third aspect of the invention, the second well in the substrate comprises a non-imaging optical element that concentrates light onto the photodetector.

BRIEF DESCRIPTION OF THE DRAWINGS

FIG. 1 is a perspective view of a prior art transceiver.

FIG. 2 is a cross-sectional view through line 2-2 shown in FIG. 1.

DETAILED DESCRIPTION OF THE PREFERRED EMBODIMENTS OF THE INVENTION

Figure 3:
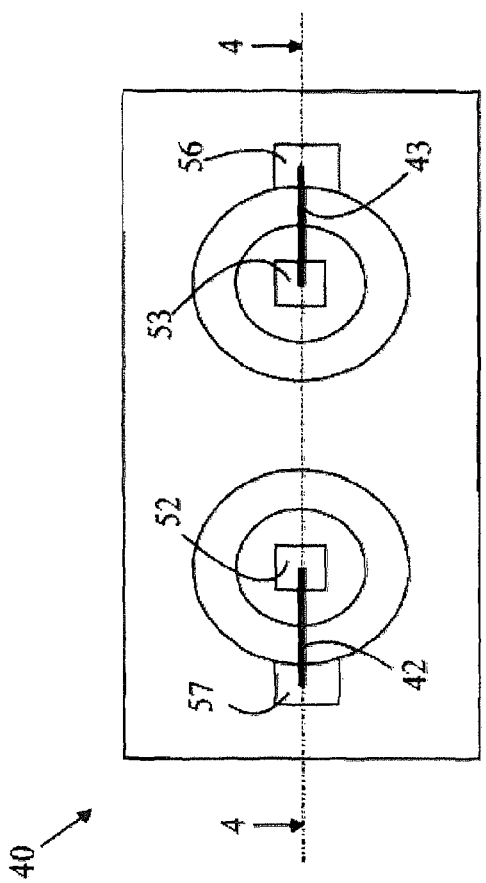
FIGS. 3 and 4, illustrate one embodiment of a transceiver according to the present invention.

The manner in which the present invention provides its advantages can be more easily understood with reference to FIGS. 1 and 2, which illustrate a prior art transceiver module. FIG. 1 is a perspective view of transceiver 20, and FIG. 2 is a cross-sectional view of transceiver 20 through line 2-2 shown in FIG. 1. Transceiver 20 includes an LED 21 and a photodiode 22 that are bonded to a carrier 25 that includes a number of electrical traces that are utilized to connect the circuit components to the carrier and the carrier to an external printed circuit board or the like. To simplify the drawings, these traces and the control circuitry that operates the LED and photodiode have been omitted. The connections to the top surfaces of the dies containing the LED and the photodiode are made via wire bonds that connect the pads on the top surface of the dies to pads on the top surface of carrier 25. A typical wire bond is shown at 24.

After the dies have been mounted on carrier 25 and connected to the various traces either by wire bonds or connection pads on the bottom surfaces of the dies, the dies are encapsulated in a clear layer 28 of epoxy or silicone that can include optical elements such as lenses 29 and 30. Lens 29 images the light from LED 21 on the relevant target, and lens 30 collects light that is to be measured by photodiode 22.

After the encapsulation process is completed, metallic shield 26 is mounted relative to carrier 25. Shield 26 is typically constructed from metal, and can be bonded to the encapsulation layer before transceiver 20 is attached to a printed circuit board. Tabs such as those shown at 27 are used to connect shield 26 to a ground connection on the printed circuit board by solder or some other form of electrically conducting adhesive. In addition, shield 26 includes a baffle 23 that blocks light generated in LED 21 from reaching photodiode 22 via reflections from the surfaces of clear layer 28.

As noted above, the lenses and shield increase the height of the transceiver, and hence, providing a design that does not utilize these elements would improve the cost and reduce the size of the transceiver. The present invention utilizes reflectors to perform the collimation and light collection functions provided by the lenses in the prior art devices. The reflectors also provide optical isolation between the light source and the receiver. In addition, the reflectors provide shielding from EMI. Finally, it should be noted that the use of the reflectors results in a transceiver that is substantially shorter than a transceiver that utilizes lenses.

Figure 4:
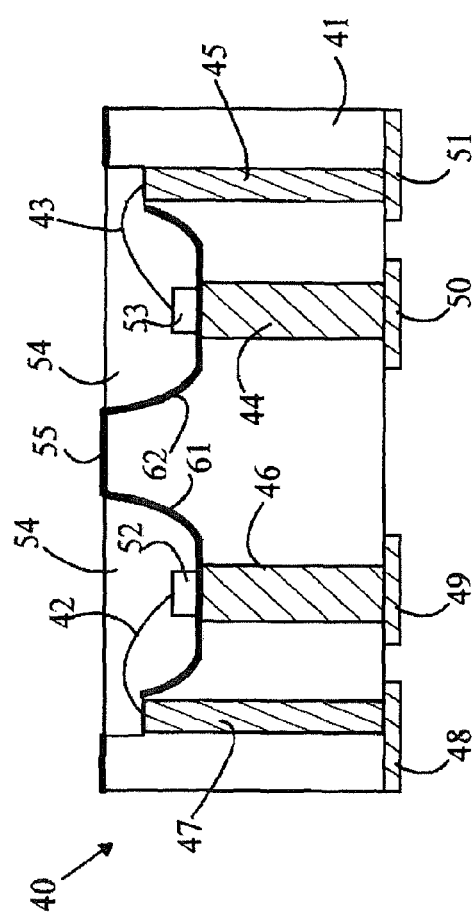

Refer now to FIGS. 3 and 4, which illustrate a transceiver according to one embodiment of the present invention. FIG. 3 is a top view of transceiver 40, and FIG. 4 is a cross-sectional view of transceiver 40 through line 4-4 shown in FIG. 3. This embodiment of the present invention can be constructed by machining a thin sheet of substrate that provides the substrates for a number of transceivers and then cutting the final substrate to form individual transceivers. The reflectors are formed substrate 41 by machining the top surface of substrate 41 to provide cups 61 and 62. Substrate 41 can be constructed from an insulating plastic. The cups can be machined by a gang of rotating tools that form the cups for a plurality of transceivers at the same time. After the cups have been formed, the surface of substrate 41 is plated with a layer 55 of reflective metal that provides both a reflective surface and an electrical conductor.

Substrate 41 includes conducting vias 44-47 that are used to provide connections to a light source 52 and a photodetector 53, which are preferably an LED and a photodiode, respectively. The dies for light source 52 and photodetector 53 have one contact on the bottom surface of the die and one contact on the top surface. The bottom contact for light source 52 is connected electrically to via 46, and the bottom contact for photodetector 53 is connected electrically to via 44. The top surface of each of these vias is exposed when substrate 41 is machined. If the bottom contacts are connected to a common power rail such as ground, then the metal layer can also be connected to these vias. If the bottom contacts must be electrically isolated, then the metal layers must be separated or the dies must be separated from the metal layer by an insulating ring.

The top contacts for light source 52 and photodetector 53 are connected to vias 47 and 45 by wire bonds 42 and 43, respectively. Since vias 45 and 47 must be isolated from metal layer 55, mesas 57 and 56 are cut over vias 47 and 45 after metal layer 55 has been plated. The mesas are larger than the cross-section of vias 45 and 47. This machining operation exposes the surfaces of the vias and removes the portion of metal layer 55 in the vicinity of the vias to provide an insulating ring about each via.

After the dies for light source 52 and photodetector 53 have been bonded to the corresponding vias and the top contacts have been connected by the wire bonds, the cups are filled with a clear material 54 that encapsulates the dies between metal layer 55 and the surface of the cups. In one embodiment, the encapsulating material is an epoxy or silicone.

The bottom surface of substrate 41 can be patterned to provide connection pads for use in accessing the vias as shown at 48-51. The pads can be constructed from a metal such as copper that is suited for surface mounted solder attachment to an underlying printed circuit board in the final product in which transceiver 40 is utilized.

Figure 5:
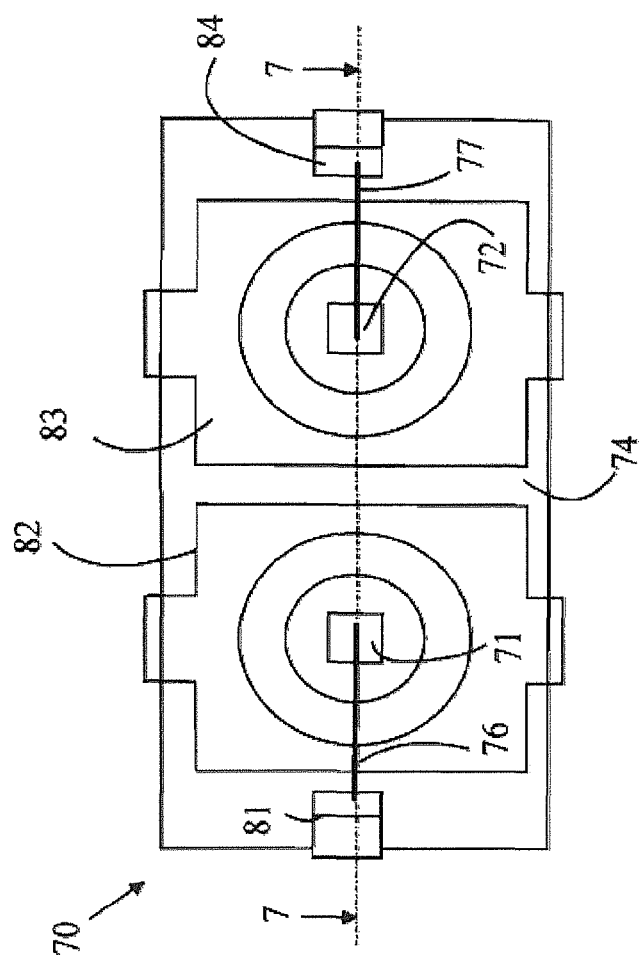
FIGS. 5 and 6, illustrate another embodiment of a transceiver according to the present invention.
Figure 6:
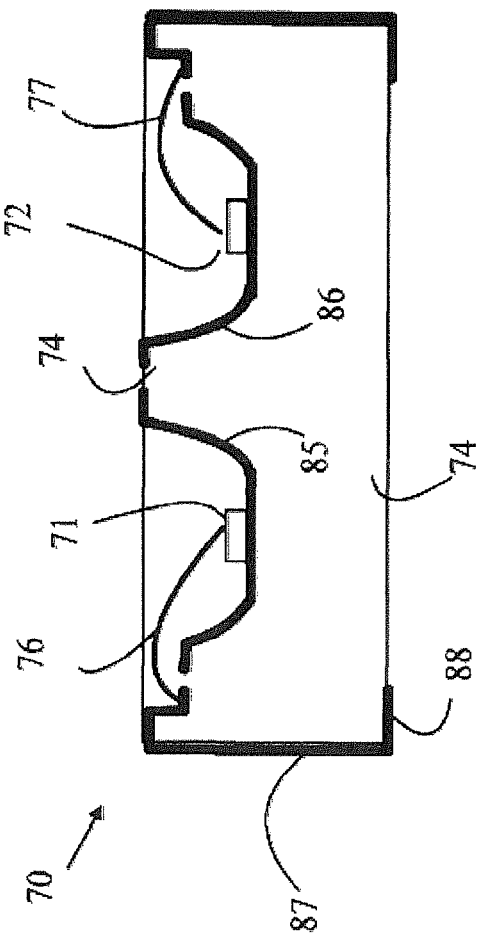

Embodiments of the present invention based on lead frames can also be constructed. Refer now to FIGS. 5 and 6, which illustrate another embodiment of a transceiver 70 according to the present invention. FIG. 5 is a top view of transceiver 70, and FIG. 6 is a cross-sectional view of transceiver 70 through line 7-7 shown in FIG. 5. Transceiver 70 is constructed on a lead frame having sections 81-84. Sections 82 and 83 are punched to form cups 85 and 86. The cups and the top surfaces of sections 81 and 84 are then plated with gold to provide a reflective cup surface and a surface suitable for wire bonding in the case of sections 81 and 84.

The dies for light source 71 and photodetector 72 are then bonded to lead frame sections 82 and 83. Again, it is assumed that one contact for light source 71 and one contact for photodetector 72 are on the bottom surfaces of their respective dies. The top contacts for light source 71 and photodetector 72 are then connected electrically to sections 81 and 84 by wire bonds 76 and 77, respectively.

The lead frame sections can include leads that are bent to form contacts on the bottom surface of transceiver 70. For example, section 81 includes leads 87 and 88. The pads formed on the bottom surface allow the transceiver to be surface mounted in the final product in which it is incorporated. Similar bent leads are provided for sections 82 and 83.

After the dies have been bonded and connected electrically, the lead frame is encapsulated in a layer of clear material 74. The individual transceivers are then singulated.

Alternatively, the lead frame can be premolded in a plastic injection molding material in a manner that leaves the top surfaces of the cups and sections 81 and 84 exposed. The dies would then be bonded to the cups and connected electrically. A layer of clear encapsulant would then be molded over the top surface of the lead frame to encapsulate the dies and wire bonds between the layer of encapsulant and the lead frame. The individual transceivers would then be singulated by cutting the lead frame.

By eliminating the lens and external EMI shield, a substantial reduction in the height of the transceiver is obtained. In addition, the cost of the transceiver is substantially reduced because the manufacturing complexity of the external EMI shield is eliminated. Finally, it should be noted that lenses utilized in the prior art transceiver designs increase the stress on the final transceiver since a relatively thick layer of clear plastic must be used to provide lenses of the required thickness and spacing from the dies.

In a transceiver according to the present invention, the dies have a significant size compared to the dimensions of the reflector, and hence, the reflectors must operate on a source or receiver that is not a "point source". Hence, a non-parabolic reflector is preferred for the cups. Non-imaging optical reflectors for providing this function are known to the art, and hence, will not be discussed in detail here. Surfaces that are shaped to provide compound parabolic or hyperbolic reflectors are particularly useful in this regard. However, simple parabolic surfaces or other shapes can be used and still provide an adequate level of collimation or concentration for many applications.

The above-described embodiments utilize a photodetector based on a photodiode. However, other forms of photodetectors such as phototransistors could also be utilized. Similarly, other forms of light sources could be utilized. In this regard, it should be noted that a VCSEL could be utilized for the light source and remove the need for the reflective cup under the light source.

Various modifications to the present invention will become apparent to those skilled in the art from the foregoing description and accompanying drawings. Accordingly, the present invention is to be limited solely by the scope of the following claims.

What is claimed is:

1. A transceiver comprising:
a light source die comprising a light source configured to be powered by applying a potential difference between first and second light source contacts on the light source die, the light source emitting light of a predetermined wavelength when so powered;
a photodetector die comprising a photodetector configured to generate a signal between first and second photodetector contacts on the photodetector die in response to illumination of the photodetector die by light; and
a substrate having first and second wells therein, the light source being mounted in the first well and the photodetector being mounted in the second well, the substrate and the first and second wells having a reflective surface that blocks light leaving the light source from reaching the photodetector without being reflected by an object that is external to the transceiver, the substrate further comprising first, second, third and fourth substrate contacts that are electrically connected to the first and second light source contacts, and the first and second photodetector contacts, respectively,
wherein the second well comprises a reflective surface shaped to concentrate light received from outside of the transceiver onto the photodetector.

2. The transceiver of claim 1, wherein the first, second, third, and fourth substrate contacts are electrically connected to pads on an outer surface of the substrate.

3. The transceiver of claim 1, wherein the light source and photodetector dies are covered by a layer of clear, electrically insulating material such that the light source and photodetector dies are encapsulated by the layer of clear, electrically insulating material and the substrate.

4. The transceiver of claim 3, wherein one of the photodetector contacts is connected to one of the substrate contacts by a wire bond that is also encapsulated in layer of clear, electrically insulating material.

5. The transceiver of claim 1, wherein the light source comprises an LED in a reflective cup.

6. The transceiver of claim 1, wherein the photodetector comprises a photodiode.

7. The transceiver of claim 1, wherein the substrate comprises a lead frame having first and second sections that comprise the first and second wells.

8. The transceiver of claim 1, wherein the second well comprises a non-imaging optical element that concentrates light onto the photodetector.

9. The transceiver of claim 1, wherein the reflective surface of the second well is shaped to provide a compound parabolic reflector.

10. The transceiver of claim 1, where in the reflective surface of the second well is shaped to provide a hyperbolic reflector.

11. The transceiver of claim 1, wherein the second well comprises a cup shape configured to concentrate light to the photodetector, the second well comprises a substantially circular bottom reflective surface and a slanted curved lateral reflective surface.

12. The transceiver of claim 11, wherein the transceiver further comprises a wire bond configured to electrically couple the photodetector to one of the first and second photodetector contacts.

13. The transceiver of claim 12, wherein a portion of the slanted curved lateral reflective surface comprises an opening for the wire bond.

14. The transceiver of claim 13, wherein the transceiver further comprises a mesa adjacent to the second well, the mesa located corresponding to the opening of the slanted curved lateral surface, and wherein a first end of the wire bond is connected to the mesa, and a second end of the wire bond is connected to the photodetector.

15. The transceiver of claim 1, wherein the transceiver further comprises a wire bond configured to electrically couple the light source die to one of the first and second light source contacts.

16. The transceiver of claim 15, wherein the first well defines a cup shape configured to collimate light, the first well comprising a substantially circular bottom reflective surface and a slanted curved lateral reflective surface.

17. The transceiver of claim 16, wherein a portion of the slanted curved lateral reflective surface comprises an opening for the wire bond.

18. The transceiver of claim 17, wherein the transceiver further comprises a mesa adjacent to the first well corresponding to the opening of the slanted curved lateral surface, wherein a first end of the wire bond is connected to the mesa and a second end of the wire bond is connected to the light source die.

19. A transceiver comprising:
a substrate having first and second wells therein;
a reflective layer on the substrate and first and second wells;
a light source mounted to the substrate in the first well; and
a photodetector mounted to the substrate in the second well;
wherein the first and second wells comprise non-imaging optical reflectors, wherein the first well is configured to collimate light emitted from the light source, wherein the second well is configured to concentrate light to the photodetector, and wherein the reflective layer is configured to provide EMI shielding to the transceiver.

20. The transceiver of claim 19, wherein the reflective layer comprises metal.

* * * * *